United States Patent [19]

Tasch, Jr. et al.

[11] 4,328,511

[45] May 4, 1982

[54] TAPER ISOLATED RAM CELL WITHOUT GATE OXIDE

[75] Inventors: Al F. Tasch, Jr., Richardson, Tex.; Geoff W. Taylor, Murray Hill, N.J.; Pallab K. Chatterjee, Richardson, Tex.

[73] Assignee: Texas Instruments Incorporated, Dallas, Tex.

[21] Appl. No.: 102,062

[22] Filed: Dec. 10, 1979

[51] Int. Cl.³ .................. H01L 27/02; H01L 29/80
[52] U.S. Cl. .................................. 357/41; 357/22
[58] Field of Search ............................. 357/22, 41

[56] References Cited

U.S. PATENT DOCUMENTS 3,868,718  2/1975  Arai ................................ 357/41
4,126,899  11/1978  Lohstroh et al. ............... 357/22

OTHER PUBLICATIONS

Arai "Charge-Storage Junction Field-Effect Transistor", IEEE Trans. Electron Devices, vol. ED-22 (4/75), pp. 181–185.

Heald et al., "Multilevel Random-Access Memory using one Transistor per Cell", IEEE J. Solid-State Circuits, vol. SC-11 (8/76), pp. 519–528.

Primary Examiner—Gene M. Munson
Attorney, Agent, or Firm—Robert Groover, III; Melvin Sharp; James T. Comfort

[57] ABSTRACT

The present invention is embodied in a dynamic random access memory (RAM) cell comprising a depletion mode field effect transistor structure with a p-n junction "gate" electrode. The cell can be programmed to two threshold voltage states providing constant current sensing. Cell programming is by application of appropriate signals to the transistor "gate" electrode and source. Reading is accomplished by sensing current through the transistor while the source is grounded. An intermediate voltage on the "gate" electrode prevents changes in the state of the cell.

9 Claims, 14 Drawing Figures

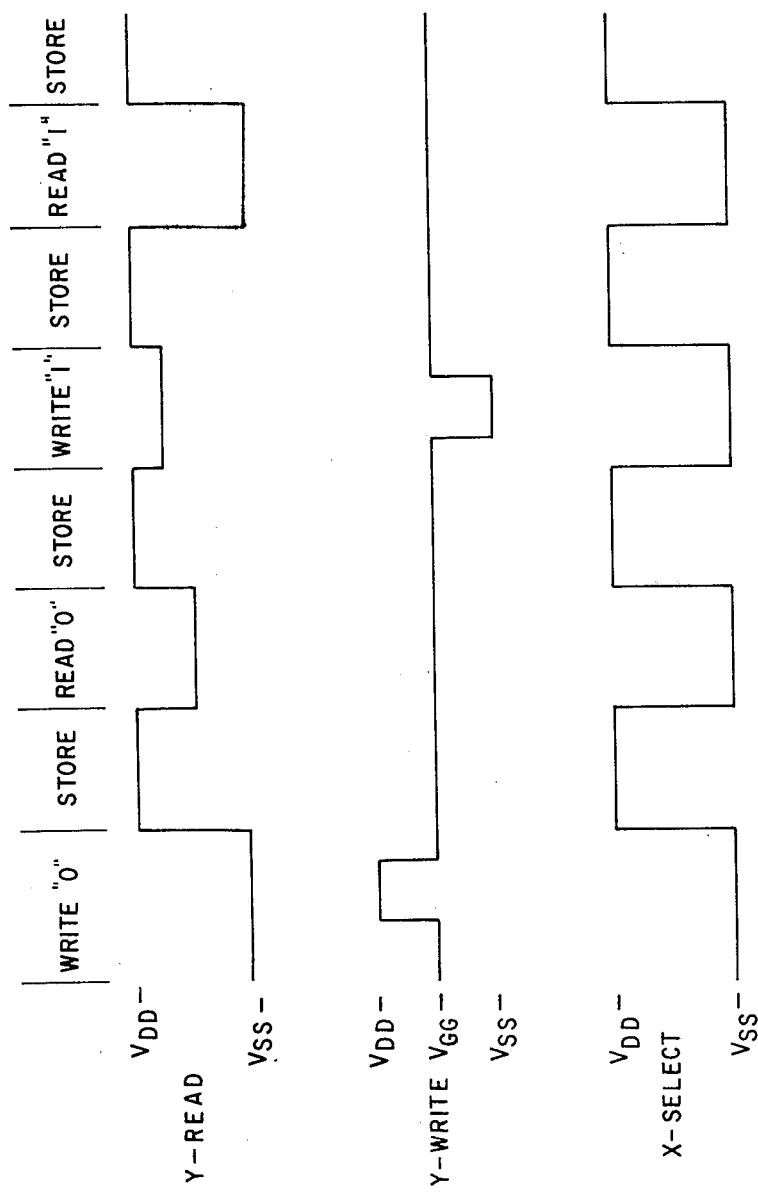

TAPER ISOLATED RAM CELL WITHOUT GATE OXIDE

BACKGROUND OF THE INVENTION

This invention is directed to semiconductor memory devices, and more particularly, to a semiconductor random access memory cell where the memory cell is a single depletion mode field effect transistor structure.

The earliest semiconductor memories were bipolar, usually transistor-transistor logic (TTL), and were limited in the number of bits per chip. With the development of the metal-oxide-semiconductor (MOS) technologies bit density has increased dramatically. At the present time N-channel MOS memories are being regularly fabricated with 16,384 bits of memory, and devices with 65,536 bits of memory are beginning to reach the market. Even higher density memories are in the design phase. To meet the demands for high density memories new technologies and device designs have been necessary. Originally, most MOS dynamic RAMs used a three-transistor memory cell. This cell is too large for present designs. Today, the one transistor-one capacitor cell is standard. Furture designs will utilize memory cells using only a single MOS transistor. A one-transistor memory cell is used in the array in TAPER ISOLATED RANDOM ACCESS MEMORY ARRAY AND METHOD OF OPERATING by Chatterjee and Taylor, Ser. No. 075574, filed Sept. 14, 1979. A similar structure used as a photodetector is shown in U.S. Pat. No. 4,000,504 by Berger. Both structures suffer from thin gate oxide pinhole problems as the devices are scaled down in size in order to accomodate a larger number of bits on a single chip.

SUMMARY OF THE INVENTION

The present invention is embodied in a dynamic random access memory cell comprising a depletion mode semiconductor transistor structure having a p-n junction "gate." The transistor structure has a buried region of the same conductivity type as the source and drain which connects the source and drain and makes the transistor operate in the depletion mode. A doped layer of the same conductivity type as the substrate lies above the buried region and serves to store majority carriers from the substrate. A doped region of the same conductivity type as the buried region lies above the doped layer adjacent to the semiconductor surface. The p-n junction formed by the doped region and the doped layer replaces the normal gate oxide and the gate electrode. The cell can be programmed to two different threshold voltage states by the presence or absence of substrate majority carriers in the doped layer. The presence of the majority carriers in the doped layer corresponds to a "1" state in the cell whereas the absence of majority carriers corresponds to a "0" state. Stored majority carriers change the conductivity in the buried region. Current flow in the transistor is different in the two states for the application of the same "gate" voltage. Sensing of the state of the cell is by measuring current flow in the transistor for a constant "gate" voltage rather than charge sensing. The cell is programmed by application of appropriate signals to the source and the "gate" electrode of the transistor. Reading is accomplished by grounding the transistor source and sensing the current flow in the transistor for an intermediate "gate" voltage. The same intermediate "gate" voltage prevents changes in the state of the cell.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein

FIG. 7 is a clocking sequence for operation of the memory array.

DETAILED DESCRIPTION OF THE DRAWINGS

Figure 1:
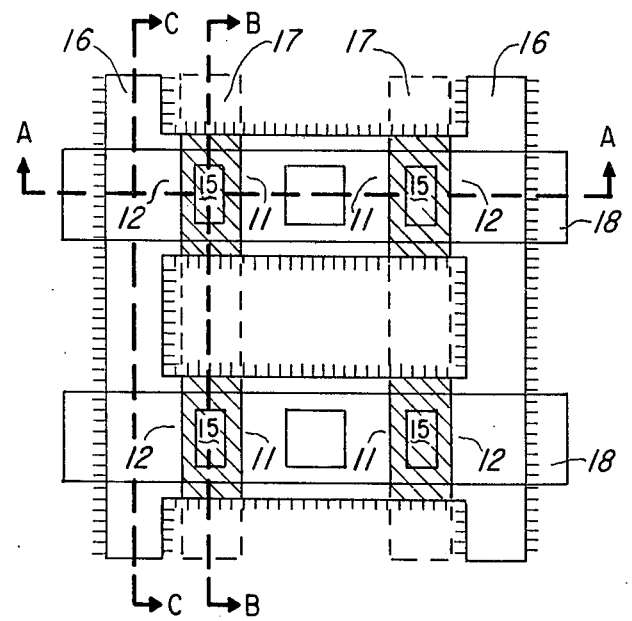
FIG. 1 is a greatly enlarged plan view of a small portion of a semiconductor chip showing the physical layout of four random access memory cells.
Figure 2A:
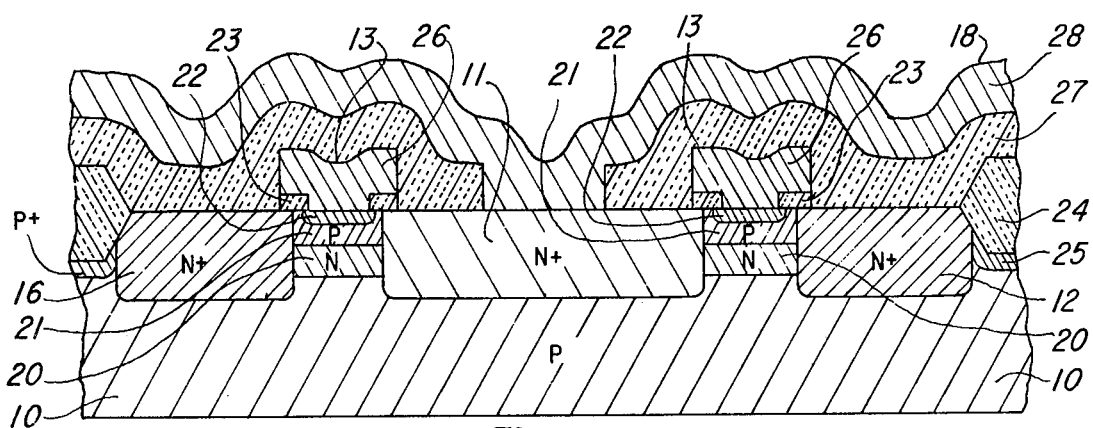
FIGS 2a–2c are cross-sectional views of the memory cells of FIG. 1, taken along the lines a—a, b—b and c—c, respectively.
Figure 2B:
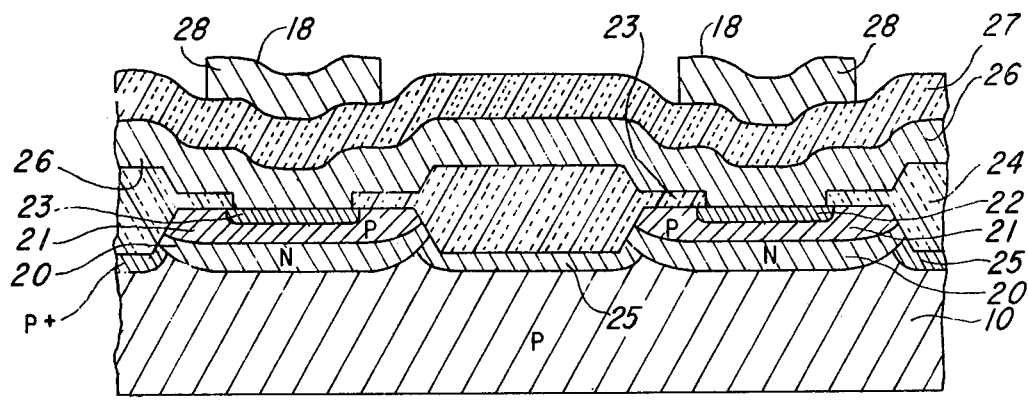
Figure 2C:
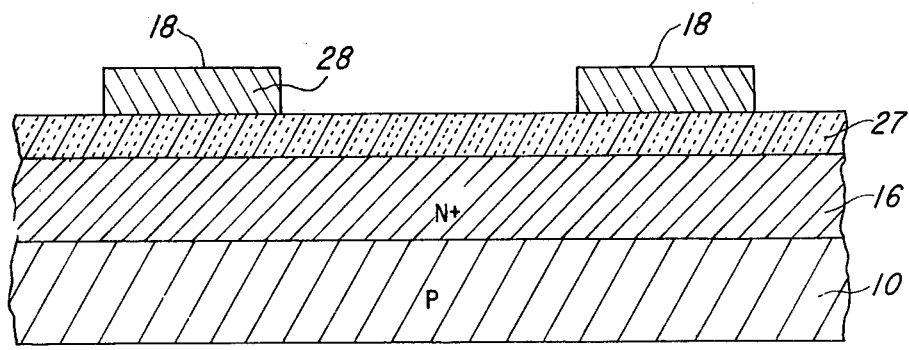

Referring to FIGS. 1 and 2a–2b, an array of four RAM cells is shown. Although an array of memory cells has been shown in the drawings an embodiment of the invention is fully demonstrated by a single transistor. The RAM cells are formed in a semiconductor body having a substrate 10 and a surface region wherein the active device components are located. The substrate 10 is p-type silicon of 6–8 ohm-cm cut on the <100> orientation. First and second doped regions 11, 12 of a conductivity type opposite that of the substrate 10 are formed in the surface region and are the source 11 and drain 12 of the transistor 15. The drains 12 in each column are common and form the Y-read line 16. A third doped region 20 of a conductivity type opposite that of the substrate 10 lies in the surface region between the source 11 and the drain 12. A first doped layer 21 of the same conductivity type as the substrate 10 lies between the source 11 and the drain 12, and above the third doped region 20. A fourth doped region 22 of a conductivity type opposite the substrate 10 lies in a shallow area of said surface region directly above said first layer 21. The p-n junction formed by the fourth doped region 22 and the first doped layer 21 replaces the normal MOS gate oxide and gate electrode. Channel stop regions 25 of the same conductivity type as the substrate 10 lie above the substrate 10. A thick layer 24 of silicon dioxide (thick field oxide) lies above the channel stoppers 25, and is adjacent to the source 11 and the drain 12. A first insulating layer 23 of silicon dioxide covers part of the surface region and has an aperture for contact to said fourth doped region 22. First conductors 13, 17 formed from a layer 26 of polycrystalline silicon lie upon the first insulating layer 23 and part of the thick field oxide 24 and extend through the apertures to make ohmic contact to said fourth doped region 22. These conductors 13, 17 form the Y-write line 17 and the "gate" electrode 13 of the transistor structure 15. A second insulating layer 27 known as multilevel oxide and comprising silicon dioxide lies upon the polycrystalline silicon 26 and the rest of the device except where the contacts are located. Second conductors 18 formed from a layer 28 of aluminum lie upon the multilevel oxide 27 and form the X-select lines 18.

Figure 3:
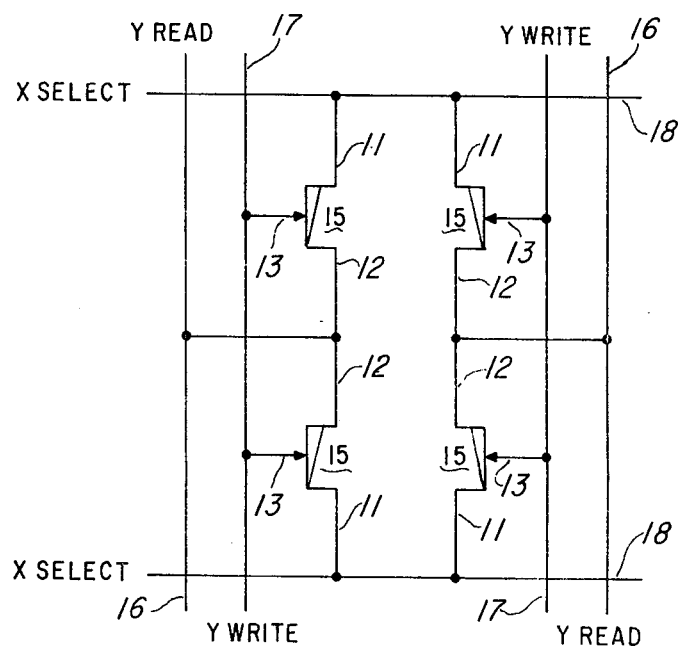
FIG. 3 is an electrical schematic of the memory cells of FIG. 1.

FIG. 3 is an electrical schematic of the array of RAM cells of FIG. 1.

Referring to FIGS. 2a-2b, a process for making the RAM of FIGS. 1 and 3 is described. The starting material is a monocrystalline semiconductor substrate 10 of p-type silicon of 6-8 ohm-cm cut on the <100> orientation. A thin layer of silicon dioxide is grown upon the substrate 10, followed by the deposition of a silicon nitride layer. The oxide and nitride layers are patterned using well known photolithographic techniques leaving silicon 10 exposed in areas where the channel stoppers 25 and thick field oxide areas 24 are to be formed. The slices are subjected to a boron implant at a dose of $10^{12}$–$10^{-}$ions/cm$^2$ at 40–100 KeV followed by a long oxidation at 900 degrees C. to form the channel stopper region 25 and thick field oxide 24. The thick field oxide 24 is 6000–10,000 angstroms thick. After the long oxidation the nitride and thin oxide layers are removed. A photoresist layer is then applied and patterned with photoresist being removed from the memory cell array. The slices are then subjected to an arsenic implant at a dose of $10^{12}$–$10^{13}$ ions/cm$^2$ at 350–450 KeV, preferably $5\times10^{12}$ ions/cm$^2$ at 400 Kev, to form the third doped region 20. The slice is then subjected to a boron implant at a dose of $10^{13}$–$10^{14}$ ions/cm$^2$ at 20–40 KeV, preferably $2\times10^{13}$ ions/cm$^2$ at 30 KeV to form the first doped layer 21. The photoresist is removed and the slice is placed in a high temperature furnace at 800–1000 degrees C. to activate the implanted impurities and grow a thin insulating layer 23 of silicon dioxide. The insulating layer 23 is grown to a thickness of 500–2000 Angstroms. A layer of photoresist is applied and patterned with resist being removed from areas where the fourth doped region 22 is desired. The slice is then placed in a hydrofluoric acid etch to form apertures in the thin insulating layer 23 where the fourth doped region 22 is desired. The slice is then subjected to an arsenic implant at a dose of $10^{14}$–$10^{15}$ ions/cm$^2$ at 10–15 KeV, preferably $5\times10^{14}$ ions/cm$^2$ at 15 KeV to form the fourth doped region 22. The photoresist is removed and a layer 26 of polycrystalline silicon is then deposited upon the slices. A layer of photoresist is applied and patterned with photoresist being removed where sources 11 and drains 12 are desired, and with photoresist remaining where the "gate" interconnects and Y-write lines 17 are to be formed. The polycrystalline silicon 26 and insulating layer 23 not covered with photoresist are removed by conventional techniques. The slice is then subjected to an arsenic implant at a dose of $5\times10^{15}$–$5\times10^{16}$ ions/cm$^2$ at 60–150 KeV, preferably $10^{16}$ ions/cm$^2$ at 100 KeV. After the arsenic implant a second insulating layer 27 comprising silicon dioxide and known as multilevel oxide is deposited upon the slice using low temperature chemical vapor deposition (CVD) techniques. The multilevel oxide 27 is grown to a thickness of 3000–6000 Angstroms. The slice is then placed in a phosphorus deposition tube at 900–1100 degrees C. for 10 to 30 minutes where $P_2O_5$ is deposited upon and becomes part of the multilevel oxide 27, and the high temperature causes the multilevel oxide 27 to reflow and give the slices a better surface topology. Next, a layer of photoresist is applied and patterned with photoresist being removed from areas where apertures for contacts are desired. The slice is then subjected to a hydrofluoric acid etch to form the apertures. A conductive layer 29 of aluminum is evaporated upon the slice to a thickness of 3000–12,000 Angstroms, preferably 8000 Angstroms, and patterned to form a top layer of interconnects. The device is then annealed in an inert atmosphere thereby completing the processing steps.

Although a specific device and process have been described it is not intended that the invention be so limited. For example, the substrate 10 could be n-type silicon or other semiconductors. The thin insulating layer 23 could be silicon nitride or other insulators. The first conductor could be aluminum, tantalum or other conductors.

Figure 4A:
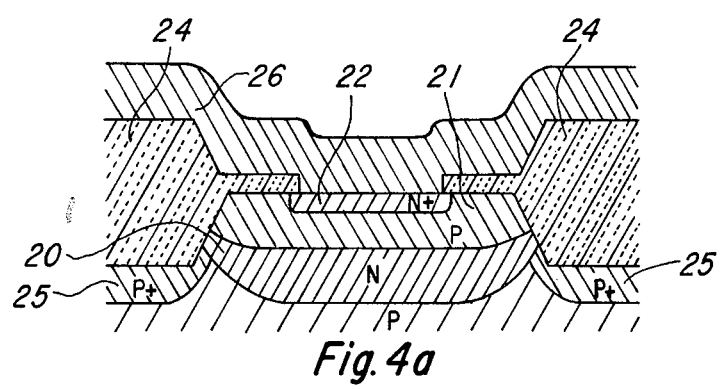
FIG. 4a is an enlarged fragmentary view of a portion of the cross-section of FIG. 2b.
Figure 4B:
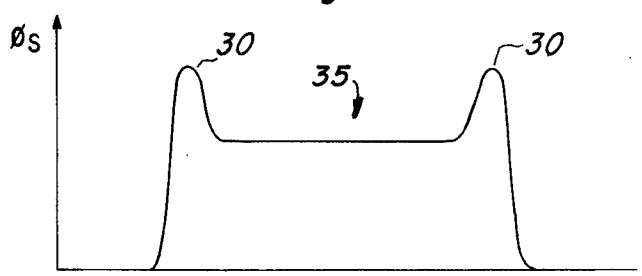
FIGS. 4b–4d are plots of the substrate surface potential distribution $\phi_s$ across the width of the transistor of FIG. 4, taken at different "gate" potentials.
Figure 4C:
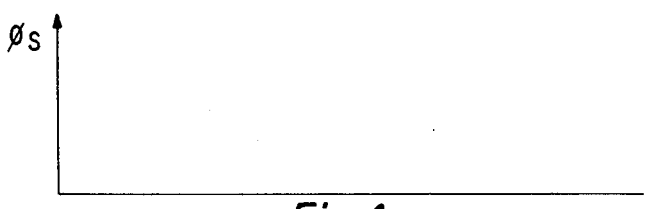
Figure 4D:
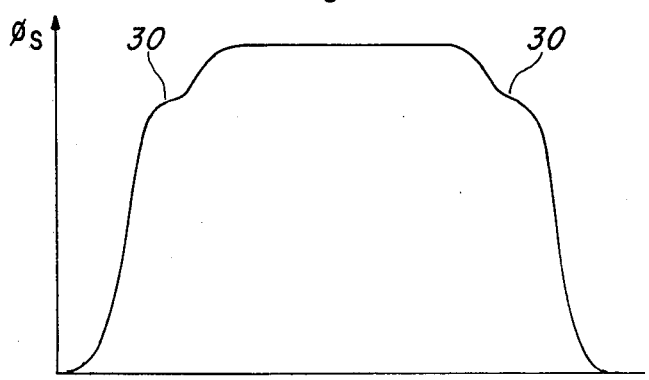

The operation of the single transistor dynamic RAM memory cell can be understood by referring to FIGS. 4a–4d. FIG. 4a is an enlarged fragmentary view of a portion of the cross-section of FIG. 2b. FIGS. 4b–4d are plots of the potential distribution $\phi_S$ across the width of the transistor of FIG. 4 taken at different "gate" potentials. $\phi_S$ is the potential along the silicon, 25, 20, 21/silicon dioxide 24, 23 interface and the potential along the junction between the first doped layer 21 and the fourth doped region 22. FIG. 4b is a plot of the potential distribution $\phi_S$ across the width of the transistor in FIG. 4a when there is a small (approximately 2.2–2.5 volts) potential on the "gate" electrode 13. This would correspond to the voltage $V_G$ (store) aplied to the "gate" electrode 13 when the cell is in either the "0" or "1" state. The cell is in the "0" state when there are no holes in the potential well 35 beneath the "gate" electrode 13. The cell is in the "1" state when holes are in the potential well 35. It is clear from examining the potential distribution of FIG. 4b that if a hole is in the potential well 35, it could not escape because of the potential barriers 30. Of course, it must be remembered that the potential distribution in FIG. 4b (and also FIGS. 4c and 4d) is only in one dimension, along the line B—B in FIG. 1. Examination of the potential across the length of the transistor along A—A in FIG. 1 and along a line from the surface of the slice down into the substrate 10 shows that there are hole potential barriers caused by the n+source 11 and drain 12, and by the n-type channel 20. Therefore, once a hole is placed in the potential well 35, it will remain there until the "gate" potential is changed from that of FIG. 4b. Note that the potential applied to the "gate" electrode 13 appears almost entirely on the first doped layer 21 because the p-n junction diode formed by the fourth doped region 22 and the first doped layer 21 is essentially floating.

To "write" a "1" into a memory cell, holes must be placed in the potential well 35. This is accomplished by taking the "gate" electrode 13 to a negative potential $V_G$ ("1"). Once the potential barriers 30 have been reduced to the substrate potential, holes will flow from the substrate 10 or the channel stoppers 25 into the first doped layer 21. The potential distribution $\phi_S$ during the time a "1" is written is shown in FIG. 4c. Note that the potential $\phi_S$ can never go below the substrate potential because holes will flow from the substrate 10 to clamp the potential at the substrate potential. After holes have been attracted into the first doped layer 21, the potential on the "gate" electrode 13 is then brought back to $V_G$ (store). This again gives the potential distribution $\phi_S$ of FIG. 4b with holes now in the potential well 35.

To "write" a "0" into the memory cell, the holes that have been placed in the cell must be removed. This is accomplished by taking the "gate" electrode 13 to a positive potential V("0"). This gives a potential distribution $\phi_S$ as shown in FIG. 4d. It is clear from FIG. 4d that under these conditions the hole barriers 30 have disappeared. Therefore, any holes in the well 35 will now flow into the substrate 10. After the holes have been removed from the first doped layer 21 the potential on the "gate" electrode 13 is brought back to $V_G$ (store). This gives a potential distribution $\phi_S$ of FIG. 4b with no holes in the potential well 35.

"Reading" of information in the memory cell is accomplished in the following manner. The memory cell transistors 15 operate in the depletion mode because of the buried channel region 20. Consequently, at zero "gate" potential, current will flow from source 11 to drain 12 when a potential is applied between source 11 and drain 12. When the potential well 35 is empty (i.e., no holes) an amount of current will flow from the source 11 to drain 12. This amount of current represents a stored "0" in the cell. When holes are stored in the potential well 35, a larger source-to-drain current will flow from the same applied potential from source 11 to drain 12 than when there are no holes in the potential well 35. This is due to the fact that when no holes are present in the first doped layer 21, the effective threshold voltage of the buried channel transistor is higher, and the device is turned on less. This amount of current represents a stored "1" in the cell. The reason a larger source-to-drain current will flow when holes are stored in the well 35 can be seen from examining FIG. 4a. The stored holes are represented by positive charge above the buried channel 20. The effect of the stored holes is the same as making the threshold voltage of the transistor more negative, which, of course, at the same "gate" voltage increases the source-to-drain current on an n-channel transistor. The different source-to-drain currents can be detected by a sense amplifier to determine the state of the memory cell (i.e., to "read" the information in the cell).

Figure 5A:
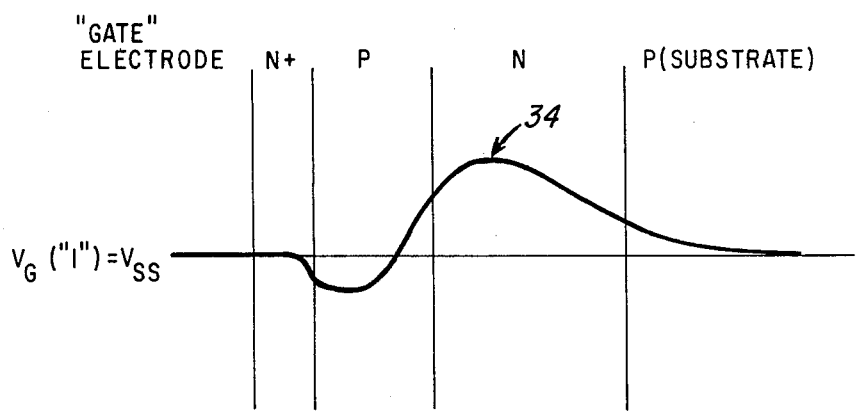
FIGS. 5a–5b are plots of the potential distribution in the device when "1" is being written.
Figure 5B:
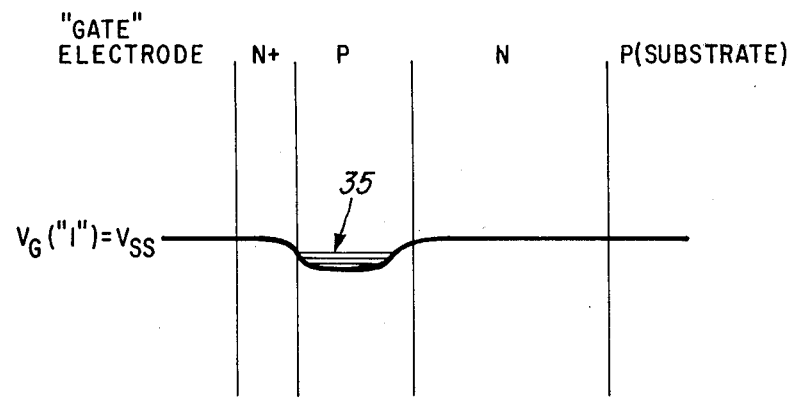
Figure 6A:
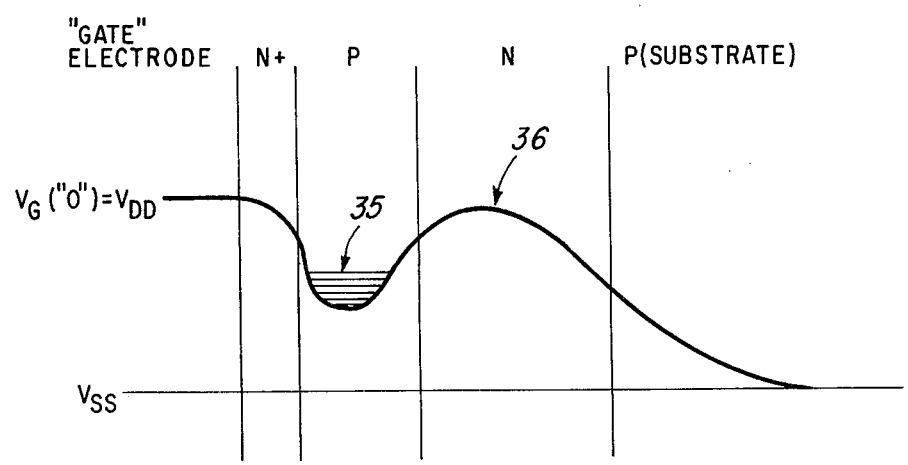
FIGS. 6a–6b are plots of the potential distribution in the device when "0" is being written.
Figure 6B:
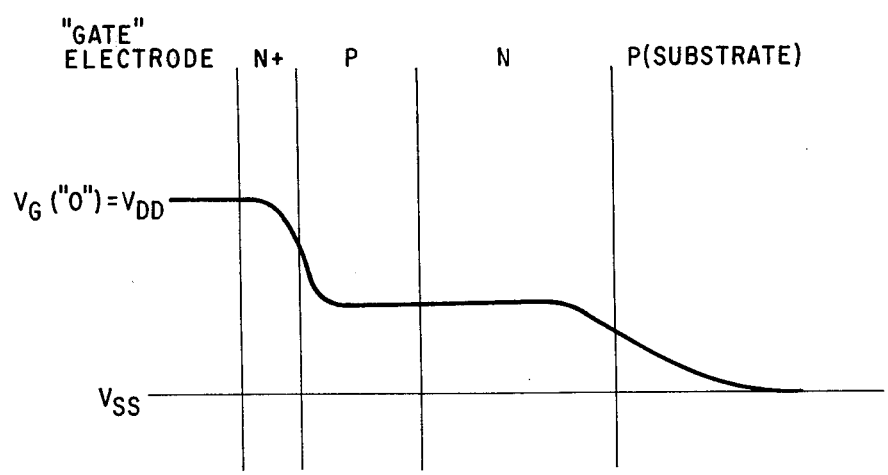

Although the above described method of "reading" and "writing" information will work for an individual memory cell, it will not work with an array of cells. With arrays there must be a selective "read" and "write" scheme. That is, there must be a way to select an individual cell in the array to "write" information into or "read" information from. In the above described method, the potential on the "gate" electrode 13 only was changed to store holes in or remove holes from the potential well 35 (i.e., to "write" information into the cell). With an array of memory cells, there must be two signals applied to "write" information into a specific cell without affecting the state of other cells. The "writing" of information into a single memory cell by the use of a signal applied to two of the memory cell terminals can be understood by referring to FIGS. 5a-5b and 6a-6b. This is the same "writing" scheme that is used in array operation. The terminals of the cell (i.e., transistor 15) to be addressed are the "gate" electrode 13, which in the array is connected to Y-write 17, and the source 11, which in the array is connected to X-select. It should be kept in mind during the following discussion that when reference is made to a potential being applied to the "gate" electrode 13 or source 11 that in the array operation the same potentials would be applied to Y-write 17 and X-select 18, respectively. As previously stated, a "0" state in the cell corresponds to an absence of stored holes in the potential well 35 whereas a "1" corresponds to stored holes. In the following discussion, it will be assumed that when a "0" is written, a "1" was in the cell previously, and when a "1" is written, it will be assumed a "0" was in the cell. FIGS. 5a-5b demonstrate the "writing" of a "1" into the memory cell, both figures being plots of potential from the "gate" electrode 13 through the fourth doped region 22, first doped layer 21, third doped region 20 and into the substrate 10. FIG. 5a shows the potential distribution when a potential $V_G$ ("1")=$V_{SS}$ (usually ground) is applied to the "gate" electrode while the potential on the source 11 is $V_{DD}$ (usually 5.0 volts). Under these conditions, there is a barrier 34 to any flow of holes from the substrate 10 into the potential well 35 and consequently no holes can be put into the well 35 under these conditions. However, when the potential on the drain 11 is brought to $V_{SS}$ as shown in FIG. 5b, the hole barrier 34 disappears and holes will flow from the substrate 10 into the potential well 35. The lines in the potential well 35 represent holes in the wall 35. To "write" a "0" into the memory cell, the holes must be removed from the potential well 35. This can be demonstrated by referring to FIGS. 6a-6b. FIG. 6a shows the potential distribution when a potential V("0")=$V_{DD}$ is applied to the "gate" electrode 13 while the potential on the source 11 is $V_{DD}$. Under these conditions, there is a barrier 36 to any flow of holes from the potential well 35 into the substrate 10. Consequently holes will remain in the well 35. However, when the potential on the source 11 is brought to $V_{SS}$ as shown in FIG. 6b, the barrier 36 is removed and holes will flow out of the potential well 35 into the substrate 10 leaving the cell in the "0" state. Thus, FIGS. 5a-5b and 6a-6b clearly demonstrate two-terminal "writing" of information in a memory cell, a prerequisite for utilization of the cell in a memory array. It should be noted that in the discussion with reference to FIGS. 5a-5b, the potential $V_G$ ("1") was taken to $V_{SS}$ instead of the negative voltage that was used when "writing" was done by using the "gate" electrode 13 only. This was accomplished by adjusting the p-type implant in the first doped layer 21 so there is a negative potential $\phi_S$ when the "gate" voltage is $V_{SS}$. If this had not been done, the "gate" voltage would have had to be taken negative with respect to the substrate 10, an unacceptable operating condition for n-channel logic.

"Reading" is accomplished in the same manner as before, by sensing the different amounts of current flowing from source-to-drain when a potential is applied between source 11 and drain 12. Alternatively, "reading" could be accomplished by passing the source-to-drain current through a load resistor and sensing the different voltages on the resistor. Either the different currents or different voltages correspond to different states of the memory cell.

The operation of an array of memory cells using the previously described two terminal addressing scheme can be seen by examining the waveforms of FIG. 7. FIG. 7 shows the signals on the X-select line 18, the Y-read line 16, and the Y-write line 17 during the "read," "write," and "store" cycles. The Y-read line 16 is connected to $V_{DD}$ through a load resistor. To "write" a "0" in a selected cell, the X-select line 18 connected to the selected cell is taken to $V_{SS}$. Then the Y-write line 17 connected to the selected cell is taken to $V_{DD}$. After the "0" is written, the voltage on the Y-write line connected to the selected cell is brought to $V_{GG}$, a voltage (approximately 2.2–2.5 volts) intermediate between $V_{DD}$ and $V_{SS}$. After Y-write line 17 connected to the selected cell is taken to $V_{GG}$, the X-select line 18 connected to the selected cell is brought to $V_{DD}$ and the cell is now in the "store" mode. To "write" a "1" into a selected cell the X-select line 18 connected to the selected cell is taken to $V_{SS}$ and the Y-write line 17 connected to the selected cell is then brought to $V_{SS}$. The Y-write line 17 connected to the selected cell is then brought back to $V_{GG}$ and subsequently the X-select line 18 connected to the selected cell is brought to $V_{DD}$. At this point, the cell is in the "1" state because of the holes in the potential well 35. To "read" the state of a particular cell, it is only necessary to bring the X-select line 18 connected to the selected cell to $V_{SS}$ while the voltage on the Y-write line 17 connected to the selected cell remains at $V_{GG}$. If there is a "1" in the cell, the voltage on the Y-read line 16 connected to the selected cell will be larger than if there is a "0" in the cell. This happens for the reasons previously explained; that is, the existence of holes in the well 35 increases the current flow in the cell transistor 15 for a given "gate" voltage.

When either "reading" or "writing," the voltage on the Y-write lines 17 and the X-select lines 18 which are not connected to the selected cell will remain at $V_{GG}$ and $V_{DD}$, respectively. This is one of the more important factors in getting the individual memory cell to operate in an array. When the voltage on Y-write 17 is at $V_{GG}$, holes cannot be added to or removed from the potential well 35 irrespective of what voltage changes occur on X-select 18. By maintaining X-select 18 at $V_{DD}$ no information can be written into a cell irrespective of the voltage on Y-write of that particular cell. These features allow an individual cell to be selected out of an array by proper selection of X-select 18, Y-write 17 and Y-read 16. For example, "writing" information into a particular cell requires the application of signals to the appropriate Y-write line 17 and X-select line 18, while maintaining the unselected Y-write line 17 at $V_{GG}$ and the unselected X-select lines 18 at $V_{DD}$. "Reading" information from a particular cell requires the selection of the appropriate Y-read line 16 and X-select line 18, while maintaining the unselected X-select lines 18 at $V_{DD}$.

Another consideration when operating a memory array is that no voltages on the chip should be lower than the substrate 10 voltage. If a voltage less than the substrate 10 voltage should be applied to a source 11 and/or drain 12, the source/drain-substrate diodes would become forward biased and power dissipation on the chip would be increased. It should be recalled that in describing the operation of the individual cell by use of the "gate" electrode 13 alone, the "gate" voltage was taken negative with respect to the substrate 10 to put holes in the well 35. To alleviate this problem, the implant in the first doped layer 21 can be adjusted so that there is a negative potential $\phi_S$ when the gate voltage is $V_{SS}$. This will eliminate the need for any voltages on the chip lower than the substrate voltage.

There are several advantages to the memory cell of the invention. The first advantage is that it allows the use of a single depletion mode semiconductor transistor as the memory cell, the structure of which is shown in FIGS. 1 and 2a–2c. This single transistor cell is extremely small and allows high packing density. Another advantage is that the structure does not use gate oxide. When MOS devices are scaled down in size to increase packing density the gate oxide must be decreased also. This creates problems in trying to form thin gate oxides which are defect free. These gate oxide problems are eliminated with the present structure. A third advantage is that the different states of the memory cell are represented by different levels of current flow in the cell. This has the advantage of giving a larger signal per unit of cell area than with the standard 1 transistor-1 capacitor MOS dynamic RAM cell, which of course simplifies sense amplifier design.

While this invention has been described with reference to illustrated embodiments, it is not intended that this description be construed in a limiting sense. Various modifications of the illustrated embodiments, as well as other embodiments of the invention, will be apparent to persons skilled in the art upon reference to this description. It is therefore contemplated that the appended claims will cover any such modifications of embodiments as fall within the true scope of the invention.

What is claimed is:

1. A semiconductor memory cell comprising:
   a substrate having a first conductivity type;
   a source region and a separate drain region within the surface of said substrate, said source and drain regions both having a second conductivity type, opposite to said first conductivity type;
   a third doped region having said second conductivity type, between said source and drain regions within said substrate;
   a first doped layer having said first conductivity type, between said source and drain regions above said third doped region;
   a fourth doped region having said second conductivity type, above said first doped layer at the surface of said substrate;
   a Y-write line above and in electrical contact with said fourth doped region, said Y-write line being separate from said source region, said drain region, and said first doped layer, said Y-write line being conductive and elongated parallel to the surface of said substrate;
   an insulating layer formed above said Y-write line;
   an X-select line electrically in contact with a first one of said source region and said drain region, said X-select line being separated from said Y-write line by said insulating layer, said X-select line being elongated in a direction which is orthogonal to the direction of elongation of said Y-write line; and
   a Y-read line within the surface of said substrate, having said second conductivity type, said Y-read line being contiguous to and continuous with the other one of said source region and said drain region, said Y-read line being elongated parallel to said Y-write line.

2. The memory cell of claim 1, wherein said Y-write line and said X-select line comprise polysilicon.

3. The memory cell of claim 1, wherein said Y-read line is continuous with said source region and said X-select line is connected to said drain region.

4. The memory cell of claim 1, wherein said Y-read line is continuous with said drain region, and wherein said X-select line is connected to said source region.

5. The memory cell of claim 1, further comprising a second identical memory cell formed adjacent thereto, said X-select line of the first one of said memory cells being continuous with and common to said X-select line of said second identical memory cell, said respective first ones of said respective source and drain regions of said first and second memory cells being contiguous and comprising a single region within said substrate comprising said second conductivity type.

6. The memory cell of claim 1, further comprising field isolation oxide everywhere on said surface of said substrate except where said X-select line or said Y-read line is located.

7. The memory cell of claim 1, wherein said first conductivity type is p type.

8. The memory cell of claim 1, further comprising writing means for forward biasing said third doped region with respect to said substrate.

9. The memory cell of claim 1, wherein said third doped region comprises an implanted region.

* * * * *